US005953282A

United States Patent [19]

Jung et al.

[11] Patent Number: 5,953,282

[45] Date of Patent: Sep. 14, 1999

[54] CIRCUIT FOR GENERATING SWITCHING CONTROL SIGNAL

[75] Inventors: Tae-Hyung Jung; Dong-Gyeun Kim, both of Cheongju, Rep. of Korea

[73] Assignee: LG Semicon Co., Ltd., Cheongju, Rep. of Korea

[21] Appl. No.: 09/074,594

[22] Filed: May 8, 1998

[30] Foreign Application Priority Data

Jan. 21, 1998 [KR] Rep. of Korea ........................ 98/1662

[51] Int. Cl.[6] ................................ G11C 8/00; G11C 7/00

[52] U.S. Cl. ................................ 365/230.05; 365/189.09; 365/226

[58] Field of Search .............................. 365/230.05, 226, 365/189.09, 189.11

[56] References Cited

U.S. PATENT DOCUMENTS 4,533,843 8/1985 McAlexander, III et al. .... 365/189.11
4,931,999 6/1990 Umeki ................................ 365/230.05
5,295,100 3/1994 Starkweather et al. ............ 365/189.11
5,757,696 5/1998 Matsuo et al. ..................... 365/189.09

*Primary Examiner*—Trong Phan
*Attorney, Agent, or Firm*—Fleshner & Kim

[57] ABSTRACT

A circuit for generating a switching control signal which is capable of selectively connecting an internal voltage in the read mode with respect to the driving voltage of a driver and connecting an external voltage in the write mode. The circuit includes a Y-decoder for decoding a Y-address, a Y-driver driven by an internal voltage or an external voltage for outputting a switching control signal, a first switching means controlled by a read enabling bar signal and applying or blocking the internal voltage to/from the Y-driver, and a second switching means controlled by the write enabling signal for applying or blocking the external voltage to/from the Y-driver.

3 Claims, 5 Drawing Sheets

CIRCUIT FOR GENERATING SWITCHING CONTROL SIGNAL

BACKGROUND OF THE INVENTION

1. Field of the Invention

The present invention relates to a circuit for generating a switching control signal for controlling a switch to connect a data from a bit line to a main amplifier, and in particular to an improved circuit for generating a switching control signal which is capable of reducing a bit line noise in the read mode and an error bit line data in the write mode.

2. Description of the Background Art

Recently, the DRAM uses an internally-downed voltage for a memory cell and a predetermined element. For example, if an external voltage VCC is 3.3V, the internal voltage VDL for an array and memory cell is 2.5V.

As shown in FIG. 1, the known read/write control circuit includes Y-decoders YDEC for decoding Y-addresses YADD inputted, drivers YSD for receiving the output signals from the Y-decoders YDEC, being driven by an internal voltage VDL and outputting a switching control signal YS, a sense amplifier SA for being controlled by a sense amplifier enabling signal SAEN and an inverted signal SAEN, amplifying a data of a bit line, writing the amplified data into a memory cell, reading a data from the memory cell, amplifying the read data and outputting the amplified data to an input/output line, switches YSSW for being turned ON/OFF by the switching control signal YS and outputting the data amplified by the sense amplifier SA to an input/output line or the data of the input/output line to the sense amplifier, and a main amplifier for receiving a main sense amplifier enabling signal, a write enabling bar signal and a read enabling bar signal, respectively, and amplifying and outputting the data of the input/output line.

Here, the switches YSSW are connected in series with the bit line, respectively and each include NMOS transistors NM1 and NM2 receiving the YS signal YS, to each of which a gate is commonly connected, respectively.

The operation of the known read/write control circuit will now be explained with reference to the accompanying drawings.

In the read mode, when the word line is enabled and the data is outputted from the memory cell to the bit line, the sense amplifier SA is enabled by the sense amplifier enabling signal SAEN for thus amplifying the bit line data.

The Y-address signal YADD is decoded by the Y-decoder YDEC, and the switching control signal YS is outputted by the driver YSD. Here, the driver YSD is controlled by the internal voltage VDL which decreases the external voltage VCC inside the chip.

Therefore, the amplified bit line data is switched by the switch YSSW which is controlled by the switching control signal YS and is outputted to the main amplifier MA through the input/output line. The main amplifier MA is enabled by the main amplifier enabling signal MAEN and the read enabling bar signal RENB and amplifies the input/output line data and outputs to the outside of the chip.

On the contrary, in the write mode, the data is inputted into the main amplifier MA from the outside of the chip, and then the main amplifier MA is enabled by the main amplifier enabling signal MAEN and the write enabling bar signal WENB and amplifies the data and outputs to the input/output line.

The data is outputted to the bit line through the switches YSSW and is amplified by the sense amplifier SA and is written into the memory cell.

In the known driver YSD, the switching control signal YS is driven by the identical internal voltage VDL even though the input/output line and bit line are differently operated in the read and write modes.

In this case, as shown in FIG. 2A, since the resistance value is high when the switches YSSW are operated, no problems occur in the read mode due to a small bit line noise. However, when writing a data into the memory cell, since the switching control signal YS is a pulse signal, a shown in FIG. 2B, the switch YSSW is closed in a state that the data are not fully amplified. At this time, if the switch YSSW is directly opened in the read mode, the bit line data may be lost.

When driving the driver using an external voltage VCC, the resistance value of the switch YSSW is decreased, and a quick amplifying operation is implemented. Therefore, it is possible to prevent the error which occurs in the write mode as shown in FIG. 3B. However, in the read mode, as shown in FIG. 3A, the bit line noise is increased due to a current flow between the input/output line and the bit line.

SUMMARY OF THE INVENTION

Accordingly, it is an object of the present invention to provide a circuit for generating a switching control signal which overcomes the aforementioned problems encountered in the background art.

It is another object of the present invention to provide a circuit for generating a switching control signal which is capable of selectively connecting an internal voltage in the read mode with respect to the driving voltage of a driver and connecting an external voltage in the write mode.

To achieve the above objects, there is provided a circuit for generating a switching control signal which includes a Y-decoder for decoding a Y-address, a Y-driver driven by an internal voltage or an external voltage for outputting a switching control signal, a first switching means controlled by a read enabling bar signal and applying or blocking the internal voltage to/from the Y-driver, and a second switching means controlled by the write enabling signal for applying or blocking the external voltage to/from the Y-driver.

Additional advantages, objects and features of the invention will become more apparent from the description which follows.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1:
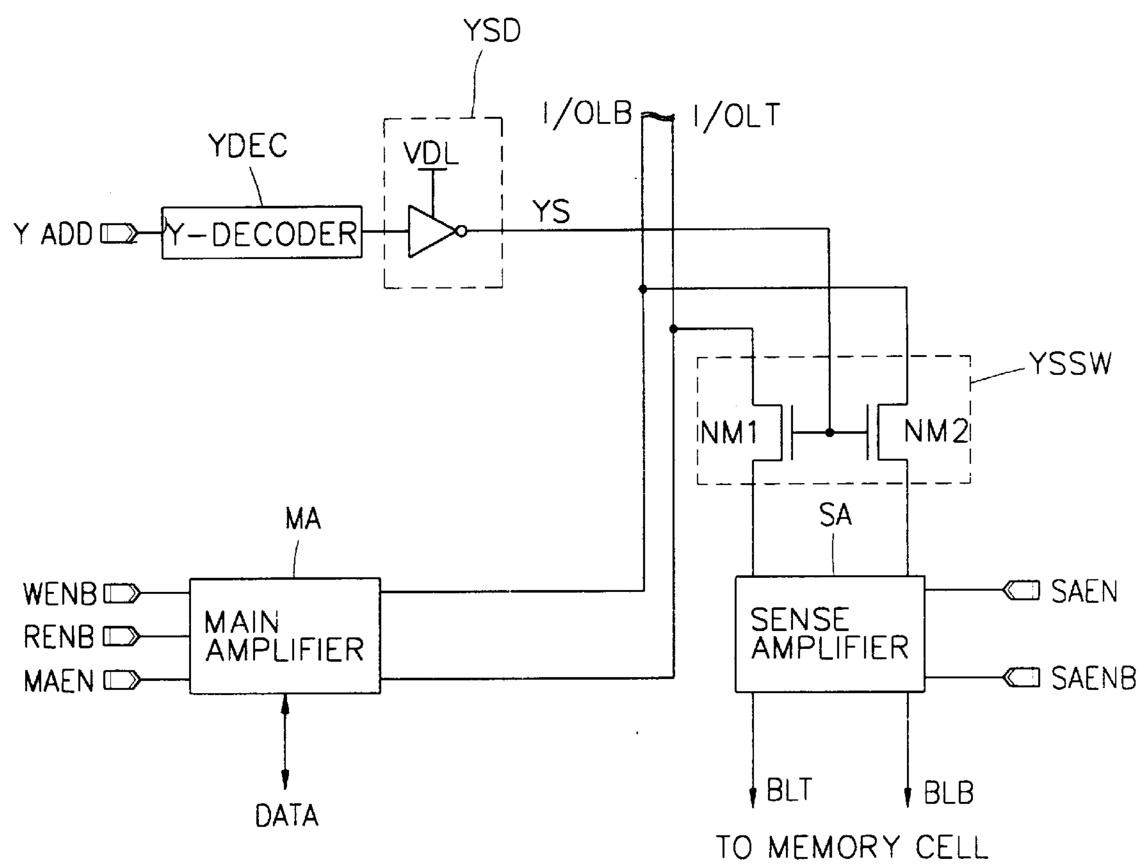
FIG. 1 is a circuit diagram illustrating a known read/write control circuit.
Figure 2A:
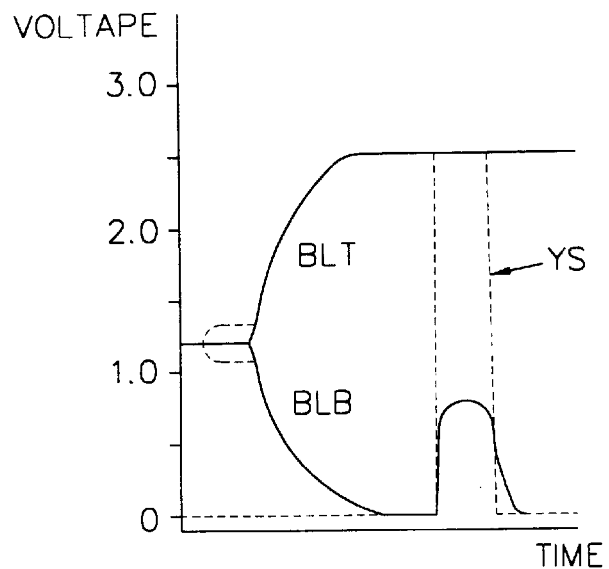
FIGS. 2A and 2B are graphs illustrating a switching control signal YS and an electric charge of a bit line when a driver is driven by an internal voltage in the circuit of FIG. 1.
Figure 2B:
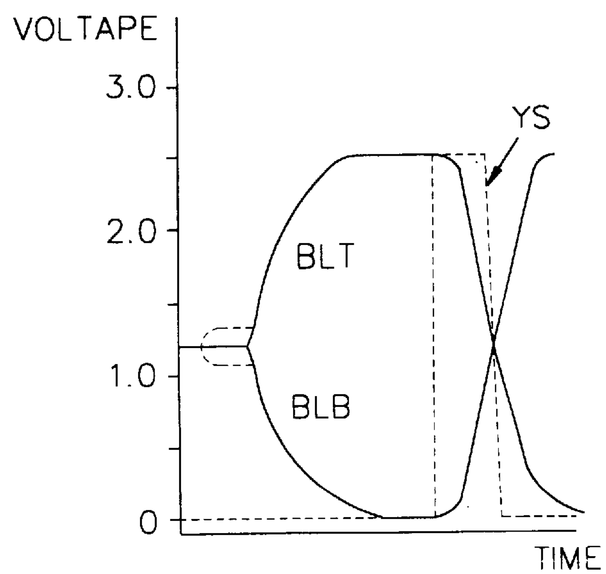
Figure 3A:
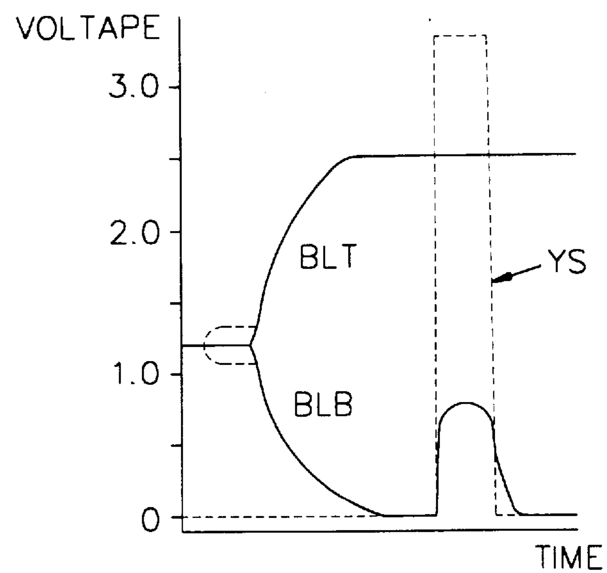
FIGS. 3A and 3B are graphs illustrating a switching control signal YS and an electric charge of a bit line when a driver is driven by an external voltage in the circuit of FIG. 1.
Figure 3B:
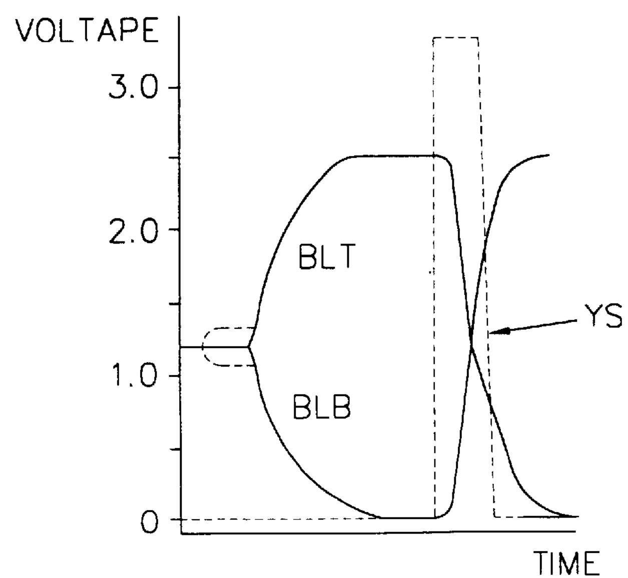
Figure 4:
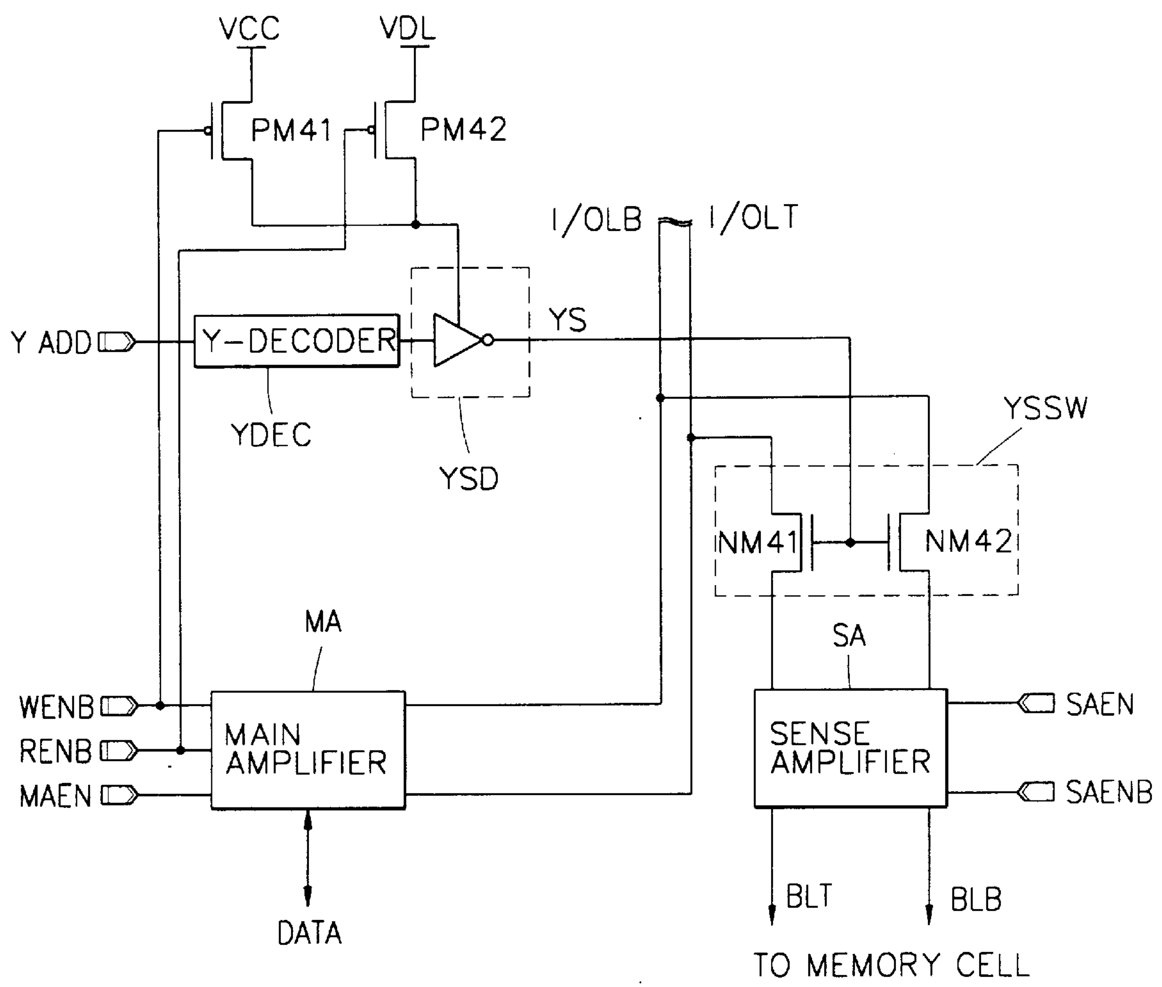
FIG. 4 is a circuit diagram illustrating a read/write control circuit according to the present invention.

As shown in FIG. 4, the read/write control circuit including a circuit for generating a switching control signal YS according to the present invention includes Y-decoders YDEC for decoding Y-addresses YADD inputted, drivers YSD for receiving output signals from the Y-decoders YDEC, being driven by an internal voltage VDL or an external voltage VCC and outputting a switching control signal YS, a sense amplifier SA for being controlled by the sense amplifier enabling signal SAEN and an inverted signal SAENB, amplifying the data of the bit line, writing the amplified data into a memory cell, reading a data from the memory cell, amplifying the read data and outputting to the input/output line, a switch YSSW for being turned ON/OFF by the switching control signal YS, outputting the data amplified by the sense amplifier SA to the input/output line and outputting the data of the input/output line to the sense amplifier SA, a main amplifier MA for receiving a main amplifier enabling signal MAEN, a write enabling bar signal WENB and a read enabling bar signal RENB, and amplifying and outputting the data of the input/output line, a first PMOS transistor PM41 the gate of which is connected with a write enabling bar signal WENB, and a second PMOS transistor PM42 the drain of which receives an internal voltage VDL and the gate of which is connected with a read enabling bar signal RENB. The commonly connected sources of the PMOS transistors PM41 and PM42 are connected with the driver YSD for thus driving the same.

Here, the switches YSSW are connected in series with the bit line, respectively and each include NMOS transistors NM41 and NM42 the commonly connected gates of which receive a switching control signal YS.

The operation of the read/write control circuit according to the present invention will now be explained with reference to the accompanying drawings.

First, in the read mode, the data is read from the memory cell and is outputted to the bit line. Thereafter, the sense amplifier SA is enabled by the sense amplifier enabling signal SAEN for thus amplifying the bit line data.

In addition, the Y-address YADD is decoded by the Y-decoder YDEC and is inputted into the driver YSD. At this time, the second PMOS transistor PM42 is turned on by the read enabling bar signal RENB. When the internal voltage VDL is inputted, the driver YSD is driven, and the switching control signal YS is outputted.

The switch YSSW is opened by the switching control signal YS, and the bit line data amplified by the sense amplifier is outputted to the input/output line and the main amplifier MA, respectively.

At this time, the main amplifier MA is enabled by the read enabling bar signal RENB and the main amplifier enabling signal MAEN and amplifies the input/output line data and outputs to the outside of the chip.

On the contrary, in the write mode, when a data is externally inputted into the main amplifier MA, the main amplifier MA is enabled by the write enabling bar signal RENB and the main amplifier enabling signal MAEN, and the external data is amplified and is outputted to the input/output line.

At this time, the Y-address YADD is decoded by the Y-decoder YDEC and is inputted into the driver YSD. The first PMOS transistor PM41 is turned on by the write enabling bar signal WENB, and the external voltage VCC is inputted. Therefore, the driver YSD is driven, and the switching control signal YS is outputted.

The switch YSSW is opened by the switching control signal YS, and the input/output line data is outputted to the bit line. The sense amplifier SA is enabled by the sense amplifier enabling signal SAEN, and the bit line data is amplified and is written into the memory cell.

Figure 5A:
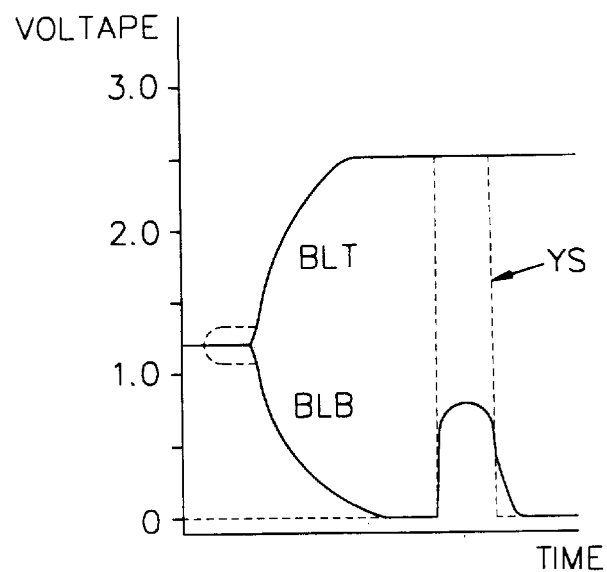
FIGS. 5A and 5B are graphs illustrating a switching control signal YS and an electric charge of a bit line in the circuit of FIG. 4.
Figure 5B:
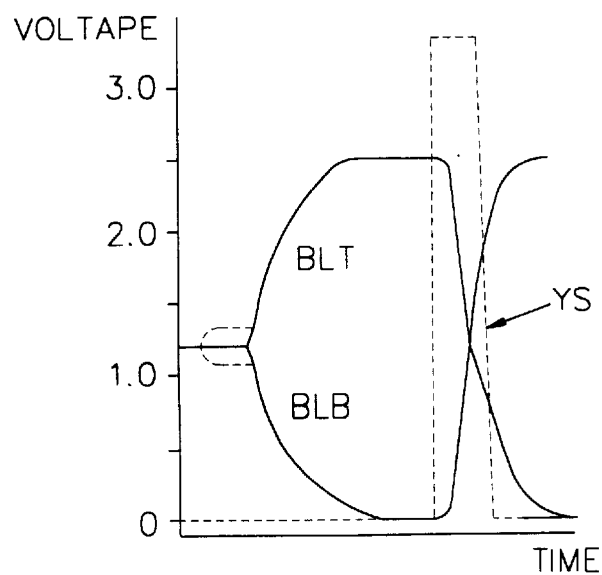

In the read mode, as shown in FIG. 5A, the driver YSD is driven by the internal voltage VDL, and the switch YSSW is driven by the switching control signal YS, so that the resistance value is increased, and thus it is possible to decrease the bit line noise. In the write mode, as shown in FIG. 5B, the driver YSD is driven by the external voltage, and the switch YSSW is driven by the switching control signal YS, so that the resistance value is decreased, and thus the bit line data is written into the memory cell, whereby it is possible to prevent a write operation error.

In addition, in the read mode, since the switch YSSW is operated by the internal voltage VDL, the bit line noise is decreased, and in the write mode, since the switch YSSW is operated by the external voltage VCC, it is possible to prevent the bit line noise which occurs in the read mode and a bit line data error which occurs in the write mode.

Although the preferred embodiment of the present invention have been disclosed for illustrative purposes, those skilled in the art will appreciate that various modifications, additions and substitutions are possible, without departing from the scope and spirit of the invention as recited in the accompanying claims.

What is claimed is:

1. A circuit for generating a switching control signal, comprising:

a Y-decoder for decoding a Y-address;

a Y-driver driven by an internal voltage or an external voltage for outputting a switching control signal;

a first switching means controlled by a read enabling bar signal and applying or blocking the internal voltage to/from the Y-driver; and a second switching means controlled by the write enabling signal for applying or blocking the external voltage to/from the Y-driver.

2. The circuit of claim 1, wherein said first and second switching means are each provided with PMOS transistors.

3. The circuit of claim 2, wherein the gates of said PMOS transistors receive a read enabling bar signal and a write enabling bar signal, respectively.

* * * * *